United States Patent [19]

Nakanishi et al.

[11] Patent Number: 5,478,398
[45] Date of Patent: Dec. 26, 1995

[54] DEVICE FOR FORMING A COMPOUND OXIDE SUPERCONDUCTOR THIN FILM

[75] Inventors: Hidenori Nakanishi; Saburo Tanaka; Hideo Itozaki; Shuji Yazu, all of Itami, Japan

[73] Assignee: Sumitomo Electric Industries, Ltd., Japan

[21] Appl. No.: 194,809

[22] Filed: Feb. 14, 1994

Related U.S. Application Data

[63] Continuation of Ser. No. 738,036, Jul. 31, 1991, abandoned.

[30] Foreign Application Priority Data

Aug. 1, 1990 [JP] Japan .................................. 2-204758
Jul. 22, 1991 [JP] Japan .................................. 3-205526

[51] Int. Cl.$^6$ ................................................ C23C 14/00
[52] U.S. Cl. ............................ 118/726; 118/729; 118/730
[58] Field of Search ................................ 118/715, 726, 118/729, 730

[56] References Cited

U.S. PATENT DOCUMENTS

| | | | |
|---|---|---|---|
| 4,701,592 | 10/1987 | Cheung | 219/121 LT |
| 5,122,636 | 6/1992 | Jung | 204/298.23 |
| 5,124,310 | 6/1992 | Ovshinsky | 505/1 |
| 5,206,216 | 4/1993 | Yoshsida | 505/1 |

FOREIGN PATENT DOCUMENTS

| | | | |
|---|---|---|---|
| 398375 | 11/1990 | European Pat. Off. . | |
| 0398374 | 11/1990 | European Pat. Off. . | |
| 62-174370 | 7/1987 | Japan | 118/715 |

OTHER PUBLICATIONS

Eryu et al, "Formation of High $T_c$ Superconducting Films by Laser Induced Fragments", Nuclear Instruments and Methods in Physics Research B, vol. 39, No. 1–4, Mar. 1989, Amsterdam, NL, pp. 640–643.

Patent Abstracts of Japan, vol. 13, No. 457, 16 Oct. 1989 & JP-A-1 177 367 (Semiconductor Energy Laboratory).

Patent Abstracts of Japan, vol. 15, No. 421 (C–878)25 Oct. 1991 & JP-A-3 174 307 (Chiyoudendou Hatsuden Kanren).

Miura S. et al, "Structure and Superconducting properties of $Y1B_a2C_u3O7\delta$ Films Prepared By Transversety Excited Atmospheric Pressure CO2 Pulsed Laser Evaporation", Applied Physics Letters, vol. 52, No. 12, 21 Mar. 1988, New York, U.S. pp. 1008–1010.

Muenchausen R. E. et al, "Effects of Beam Parameters on Excimer Laser Deposition of $YBa_2Cu_3O_{7-\delta}$", Applied Physics Letters, vol. 56, No. 6, 5 Feb. 1990, New York, U.S., pp. 578–580.

Roas, Appl. Phys. Lett. 53(16), 17 Oct. 1988 pp. 1557–1559.

Dubowsli, "Pulsed Laser Evaporation and Epitaxy of Thin Semiconductor Films". Butterworth & Co., 1988.

Greer, Proceedings of the Third Anual Confrence on Superconductivity and Applications, Buffalo N.Y., Sep. 1989.

Wu, Appl. Phys. Lett. 56, (15), 9 Apr. 1990.

Singh, Appl. Phys. Lett. 54 (22), May 29, 1989, pp. 2271–2273.

*Primary Examiner*—Richard Bueker
*Attorney, Agent, or Firm*—Beveridge, DeGrandi, Weilacher & Young

[57] ABSTRACT

There is disclosed a device for forming a thin film on a substrate by irradiating a target of a compound oxide superconducting material with a laser beam and evaporating on the substrate a thin film corresponding to a composition of the target in an oxygen ambient atmosphere by laser evaporation, a scanning optical system for causing the laser beam to scan being disposed in an optical path of the laser beam.

4 Claims, 4 Drawing Sheets

DEVICE FOR FORMING A COMPOUND OXIDE SUPERCONDUCTOR THIN FILM

This application is a continuation of application Ser. No. 07/738,036, filed Jul. 31, 1991, now abandoned, which application is entirely incorporated herein by reference.

BACKGROUND OF THE INVENTION

1. Field of the Invention

This invention relates to a device for forming a compound oxide superconducting thin film. Specifically, the invention relates to a device for forming a compound oxide superconducting thin film by laser evaporation.

2. Prior Art

Superconductivity phenomenon, which is said to be related to a phase transition of electrons, has been recognized as a phenomenon observed only at very low temperatures whose realization requires liquid helium. But in 1986 Bednorz, Muller et al. discovered $(La,Ba)_2CuO_4$, which exhibits superconductivity at 30K. In 1987 Chu et al. discovered that $YBa_2Cu_3O_y$ has a superconductivity critical temperature Tc in the order of 90K. In 1988 Maeda et al. discovered the so-called Bi-system compound oxide superconducting material having a critical temperature higher than 100K. These compound oxide superconducting materials can exhibit superconductivity phenomenon even with cooling by inexpensive liquid nitrogen. The potential of the practical applicability of superconduction technology has been noted.

Compound oxide superconducting materials having the above-described high critical temperatures were originally prepared in sintered bodies by powder metallurgy. But the sintered bodies could not exhibit preferable characteristics, especially critical current density, etc. Recently processes for forming superconducting materials in thin films have been studied. Usually compound oxide superconducting thin films are formed on $SrTiO_3$ mono crystal substrates, MgO mono crystal substrates, etc., by various kinds of evaporation, such as vacuum evaporation, spattering, etc.

The compound oxide thin film formed by various kinds of conventionally known evaporation techniques do not generally exhibit sufficient superconductivity as formed. To make them useful superconducting thin films, it is necessary to post-anneal the thus-formed compound oxide thin films. That is, it is generally known that compound oxide superconducting materials exhibit high oxygen non-stoichiometry, and also that the lower non-stoichiometry they have, the higher the superconductivity they exhibit. In conventional superconducting thin films, the post-annealing is performed for the purpose of supplementing oxygen due to the oxygen non-stoichiometry.

But it is known that when a thin film formed on a substrate is annealed, the substrate material is diffused into the thin film, and in the region near the substrate, the quality of the superconducting thin film is much degraded. The thus-treated thin film is usable only at a portion near the surface for experimental purposes, but it is not usable for practical purposes, such as production of various devices, etc. Under these circumstances, laser evaporation, which has not been so far noted, is suddenly noted.

Laser evaporation comprises irradiating a target with a high power laser beam, evaporating material from the target, and depositing the same on a substrate. The heating of the target and the substrate can be controlled independently of each other. It is not always necessary to make the ambient atmosphere highly vacuum. It is possible to increase the film forming speed by selecting suitable conditions. In addition, when a compound target is used, little composition change is observed between the composition of the target and that of the thin film which is formed. Thus, laser evaporation is considered suitable to form compound oxide superconducting materials in thin films. It has been confirmed that the compound oxide superconducting films formed by laser evaporation without the above-described post-annealing step exhibit useful superconductive characteristics. Laser evaporation is expected to be dominant in processes for forming oxide superconducting films. In the above-described laser evaporation process, when a laser beam irradiates a target, a blaze-like thing is generated. This blaze-like thing is called a plume. This is a collection of active materials generated from the surface of the target by the irradiation of the laser beam, and it is deposited on a substrate, so that a thin film is formed.

But a sectional area to be contributed to the film formation by the plume is generally smaller than the area of the substrate. A thin film is formed by laser evaporation only on a part of the film forming surface of the substrate. On a typically substrate having a size of about 20 mm×20 mm, a thin film which can exhibit effective superconductive characteristics is formed in about a 10 mm-diameter at most. Such small thin films are not practical.

SUMMARY OF THE INVENTION

This invention relates to a device for forming a thin film by laser evaporation. An object of this invention is to provide a device for forming a thin film, especially a thin film of a compound oxide superconducting material, on a substrate having a larger film forming surface.

It is an object of the present invention to provide a device for forming a thin film on a substrate by irradiating a target of a compound oxide superconducting material with a laser beam and evaporating a part of the target, and forming a thin film corresponding to the composition of the target on the substrate in an oxygen ambient atmosphere by laser evaporation. A scanning optical system for causing the laser beam to scan is disposed in an optical path of the laser beam.

The present invention will become more fully understood from the detailed description given hereinbelow and the accompanying drawings which are given by way of illustration only, and thus are not to be considered as limiting the present invention.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The device according to this invention is a device for forming a compound oxide superconducting thin film by laser evaporation. The invention is characterized by a scanning optical system such as a rotary polygon mirror and a typical unit used in a film forming device.

Figure 4:
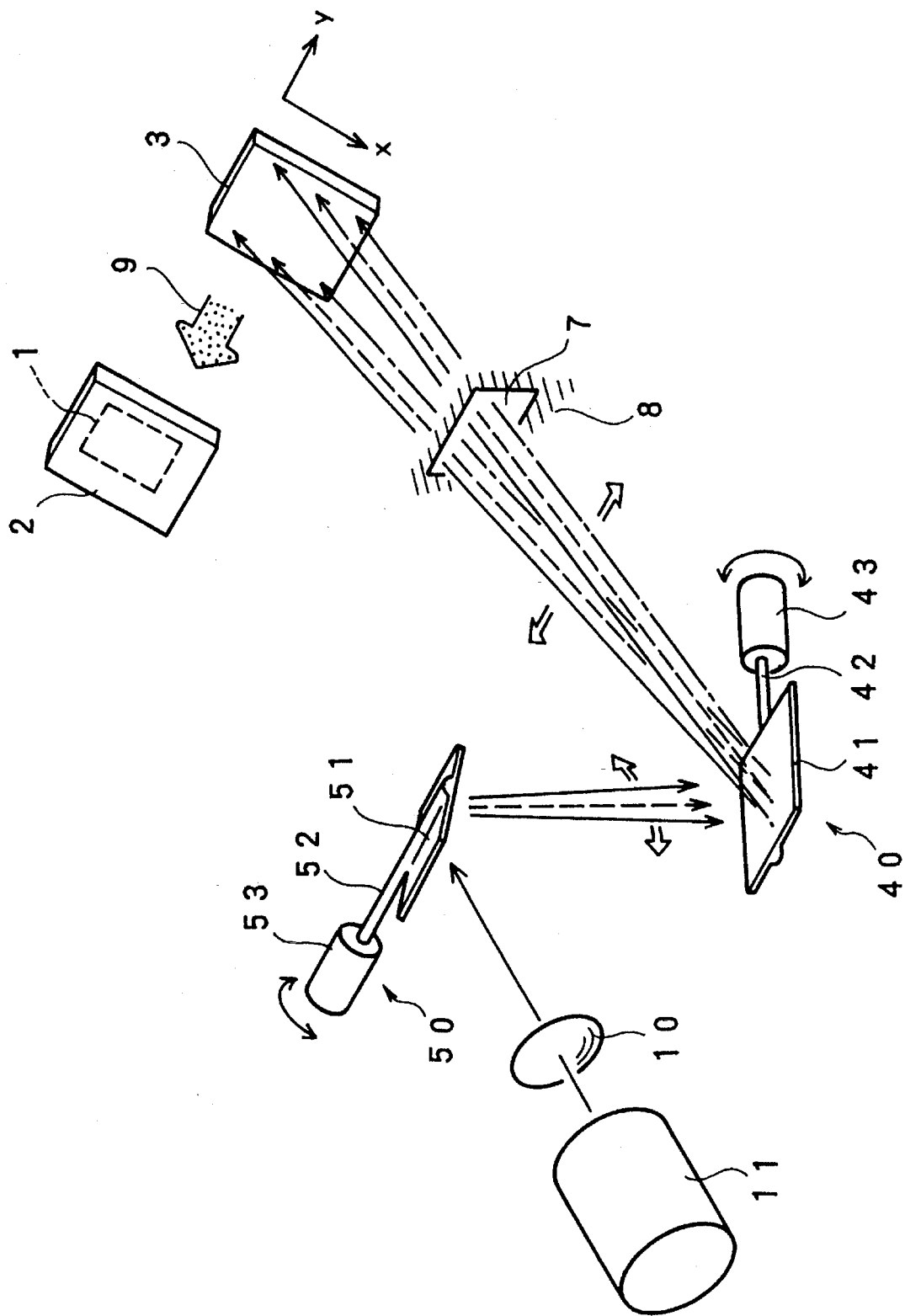
FIG. 4 is a pictorial view of an arrangement of the device for forming a superconducting thin film according to a second embodiment of this invention.

That is, the device according to this invention has realized that if a laser beam is caused to scan the target by, e.g., a rotary polygon mirror, a larger area superconducting thin film is formed than the thin film layer area formed by a fixed laser beam. But, in the case where the scanning direction of a laser beam by the scanning optical system is one dimensional, it is preferable to transfer the substrate in a direction perpendicularly to the direction of scanning of the laser beam, to thereby form the film on the substrate. Thus a superconducting thin film can be formed over a required area. The scanning optical system may be so arranged that a laser beam can be caused to scan two-dimensionally. This embodiment is shown in FIG. 4. In this embodiment, a first galvanometer mirror deflects a laser beam in one direction, and a second galvanometer mirror causes the laser beam to scan in a direction perpendicular thereto, whereby two-dimensional scanning can be performed. This arrangement according to the invention does not require transfer of the substrate. This arrangement enables a laser beam spot on a target to scan over the target, and as the result, local consumption of the target can be prevented. In other words, one target can last longer, and substantial consumption of a target can be decreased.

This invention is applicable to all thin film forming techniques using laser evaporation, and the superconducting thin films to which this invention may be especially effectively applied are oxide superconducting materials including La—Ba—Cu, Y—Ba—Cu, Bi— and Tl-system oxides, which are formed on $SrTiO_3$ or MgO single-crystal substrate, etc.

Figure 1:
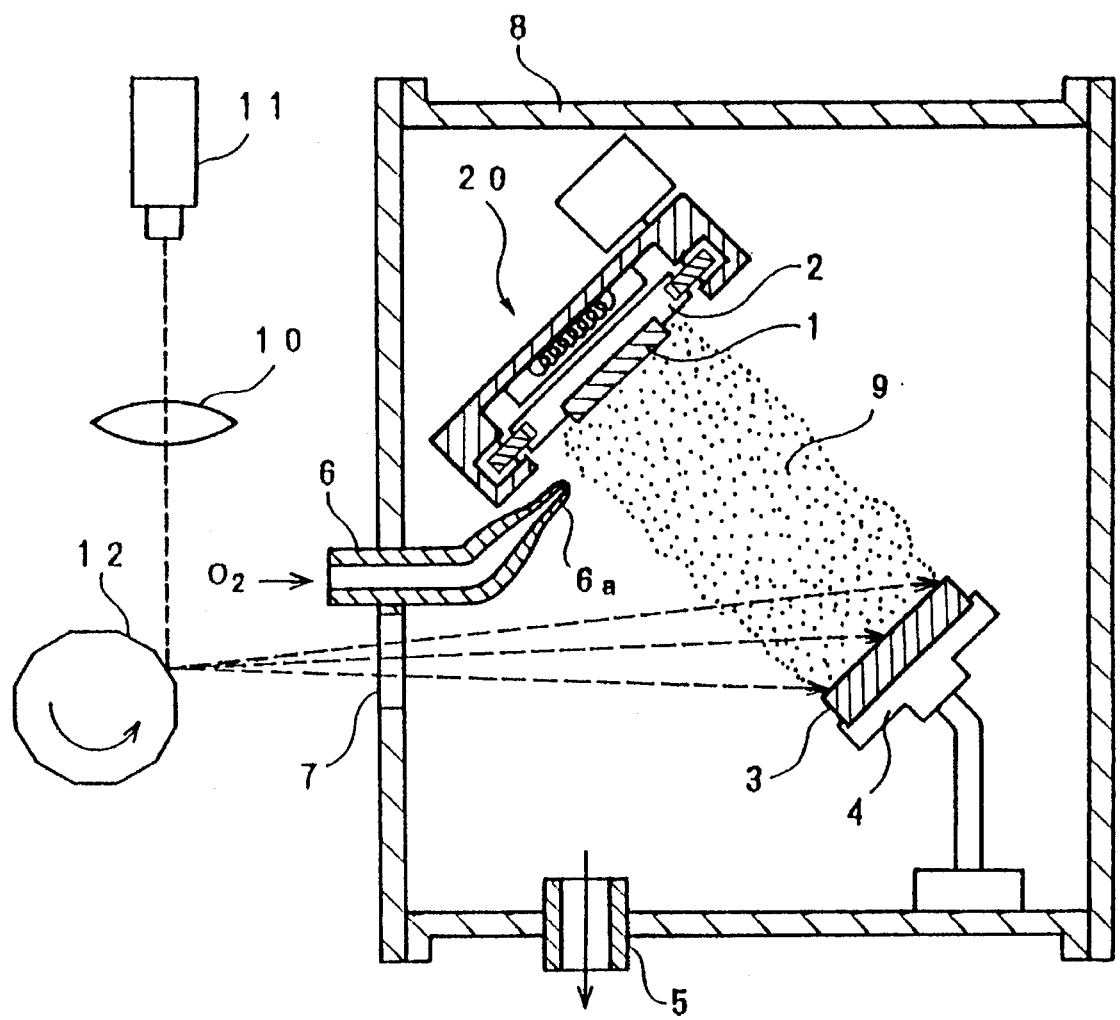
FIG. 1 is a pictorial view of an arrangement of the device for forming a superconducting thin film according to a first embodiment of this invention.

FIG. 1 is a pictorial view of an arrangement of the device for forming a thin film according to a first embodiment of this invention. The interior of the film forming chamber is shown in a sectional view in FIG. 1.

As shown in FIG. 1, this device mainly comprises a film forming chamber 8 which houses a substrate holder 2 for holding a substrate 1 and a target holder 4 for holding a target 3. The device further and has an exhaust port 5, an oxygen supply port 6 and a laser beam entrance window 7. A laser irradiating means means is included with the devices. The laser irradiating means includes a laser 11 which has an optical system 10 and generates a laser beam, and a rotary polygon mirror 12.

The substrate holder 2 is set on a translating device 20 for the substrate holder 2, which will be explained later, and the substrate holder 2 is movable back and forth with respect to the sheet of FIG. 1. The oxygen supply port 6 is connected to a nozzle 6a so that oxygen gas is blown near a film forming surface of the substrate 1.

As shown in FIG. 1, the oxygen supply port 6 and nozzle 6a are arranged so as to blow oxygen gas ($O_2$) onto and along the surface of the substrate. The optical system 10 converges a laser beam emitted from the laser 11 or expands the beam radius of the laser beam to supplement its output power. The optical system 10 is designed suitably to meet necessary film forming requirements.

Figure 2:
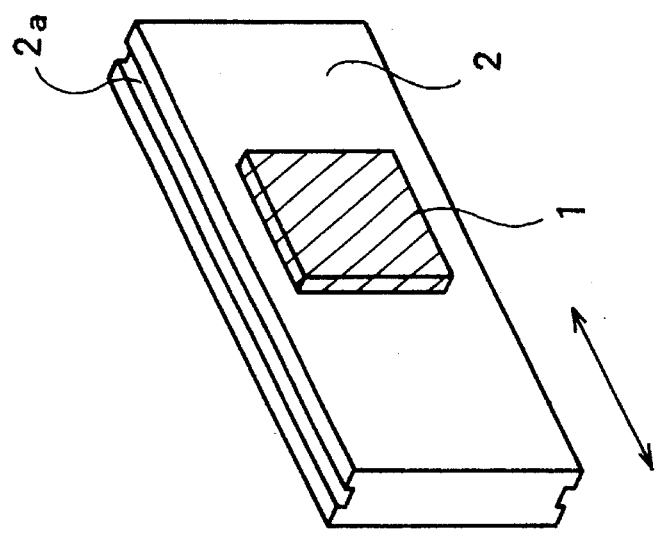
FIG. 2 is a view of an arrangement of a substrate transfer device used in the device of FIG. 1.
Figure 2:
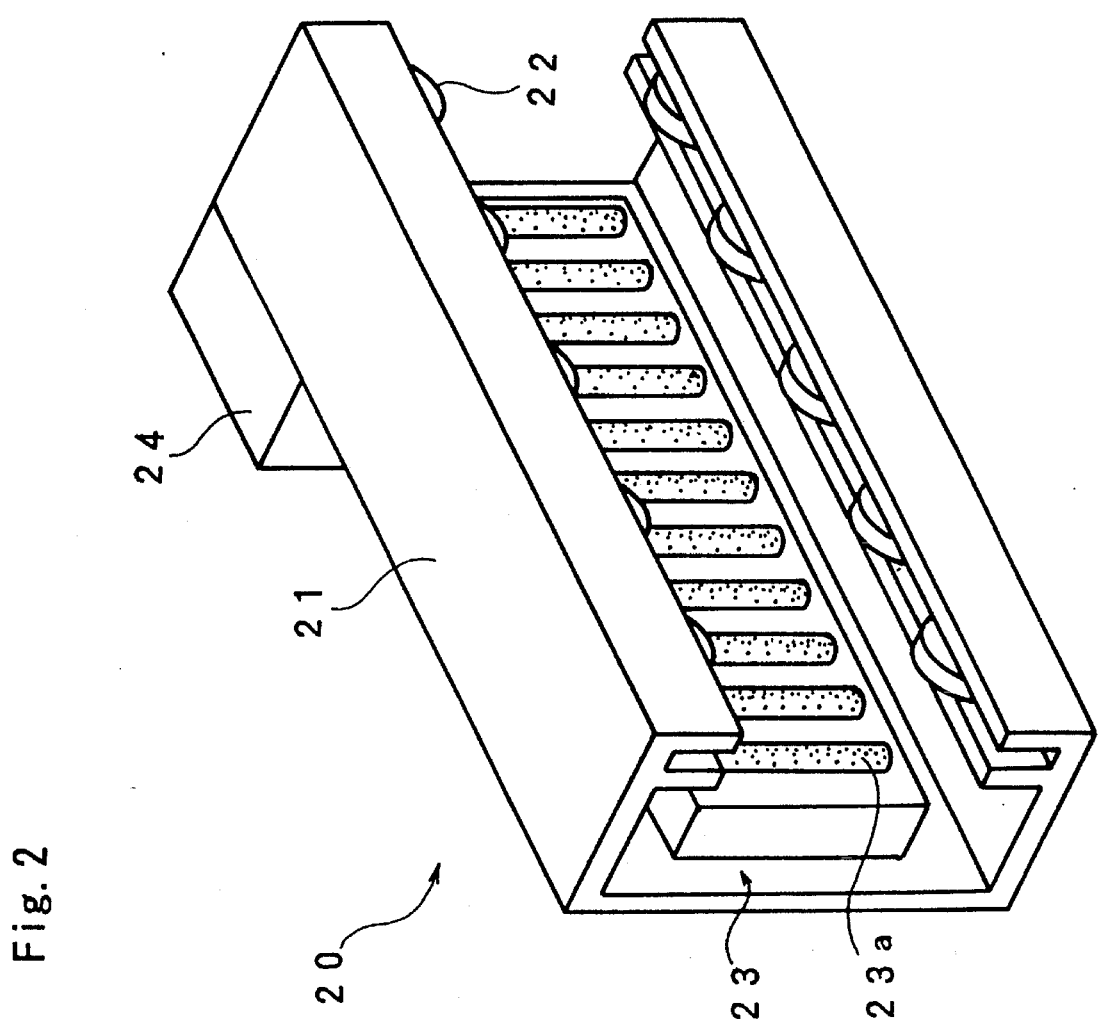

FIG. 2 shows a structural example of the transfer device 20 for the substrate holder 2 shown in FIG. 1. In FIG. 2, the transfer device 20 is laid on a side with a film forming surface of the substrate facing outward.

As shown in FIG. 2, the transfer device 20 mainly comprises a frame 21 having a predetermined sectional shape, and a plurality of pairs of guide rollers 22 with the rollers of each pair opposed to each other. The guide rollers 22 are arranged so as to engage in a pair of guide grooves 2a cut in both side walls of the plate-shaped substrate holder 2. Some of the guide rollers 22 are forcedly driven by driving means 24. The driving means 24 may be reversible to thereby reverse a transfer direction.

In the frame 21, there is provided a heater 23. The heater 23 comprises a plurality of rod-shaped heating bodies 23a arranged perpendicular to a transfer direction. Each of the rod-shaped heating bodies 23a can be individually controlled, so that temperature distributions can be formed in a transfer direction of the substrate holder 2.

The transfer device 20 of the above-described structure is used as follows. The substrate holder 2 including a substrate 1 set on is inserted into the frame 21 so that the guide rollers 22 are engaged into a pair of guide grooves 2a. The frame 21 is placed at a set position in the film forming chamber of FIG. 1. The driving means 24 is actuated to transfer the substrate 2 linearly. At this time, the heater 23 is turned on to heat the substrate 1 up to a required temperature. For accurate temperature control, it is preferable to make the substrate holder 2 of a metal or ceramic having good heat conductivity.

In the device for forming a thin film having the above-described structure, the film forming operation is explained as follows.

A substrate 1 and a target 3 are set on the substrate holder 2 and a target holder 4, respectively, and then the film forming chamber 8 is degassed. Subsequently, with the rotation the rotary polygon mirror 12, the laser 11 is actuated to irradiate a laser beam onto the target 3. The transfer device 20 is moved during the irradiation of the laser beam, so that plume 9 generated from the target 3 radiates all over the substrate 1. During the film forming, oxygen gas is blown from the nozzle 6a onto a film forming surface of the substrate 1. By this operation, a uniform thin film can be formed on the entire surface of the substrate 1.

Figure 3:
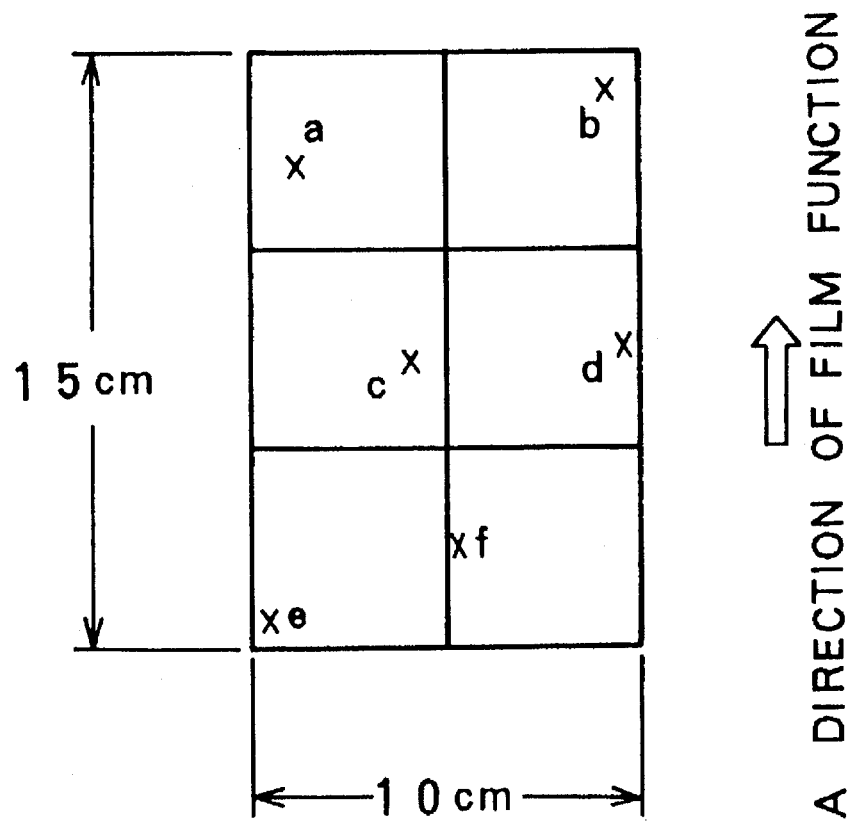
FIG. 3 is a plan view of a test-formed large area-thin film.

The inventors actually formed Y—B—C—O system thin films using the same device as shown in FIGS. 1 and 2. An Ar—F pulse laser oscillator having an output energy density of 2 $J/cm^2$ on the surface of the target and 10 Hz frequency was used as the laser beam source. As the target, a sintered body of $YBa_2Cu_3O_x$ having a size of 15 cm×3 cm×1 cm was used. As the substrate, 2×3 array sheets of MgO(100) having a size of 5 cm×5 cm substrates were located as shown in FIG. 3. The distance between the substrate and the target was set to be 5 cm. The interior of the film forming chamber was kept at a vacuum of 200 mTorr. Oxygen was blown onto the substrate from the nozzle 6a at the rate of 30 cc/min. The film forming temperature was 700° C. The polygon mirror had 12 planes. The rotation speed was 5 rpm. The thin film forming was conducted for 50 minutes under these conditions. On Positions (a) to (f) in FIG. 3, the thickness of the film (Angstrom: Å), the critical temperature Tc (K), and the critical current density Jc ($A/cm^2$) were measured. The following is the resultant data.

| Positions | Thickness (Å) | Tc(K) | Jc(A/cm$^2$) |
| --- | --- | --- | --- |
| a | 800 | 89 | $5.0 \times 10^6$ |
| b | 780 | 88 | $4.0 \times 10^6$ |
| c | 820 | 89 | $5.5 \times 10^6$ |
| d | 780 | 88 | $4.8 \times 10^6$ |
| e | 790 | 87 | $4.2 \times 10^6$ |
| f | 820 | 89 | $5.2 \times 10^6$ |

It was found that by using this embodiment, a homogeneous, good compound oxide superconducting thin film can be formed over even an area as large as about 15 cm×10 cm.

The device for forming a thin film according to a second embodiment of this invention will be explained below with reference to FIG. 4.

The arrangement of FIG. 4 is the same as that of the first embodiment of FIGS. 1 and 2 in that a substrate 1 is held by a substrate holder 2, a target 3 is held by a target holder (not shown), and these holders are housed in a film forming chamber 8 with a laser beam entrance window 7. It is also the same as in the first embodiment that an oxygen supply nozzle (not shown) is disposed near the substrate 1, and a laser beam from a laser beam source 11 is condensed by a lens 10. The following three points are differences of the second embodiment from the first one.

Firstly, in place of the rotary polygon mirror, a galvanometer mirror 40 is used as an optical system for the scanning of a laser beam (scanning in the Y direction on the target). The galvanometer mirror 40 comprises a plane mirror 41 inserted in an optical path of the optical system, and a shaft 42 fixed to the center of the plane mirror 41. An electromagnetic reversible driving means 43 is connected to the shaft 42. The galvanometer 40 is driven reversibly within a set range in the directions indicated by the arrows in FIG. 4, so that the incident angle of a laser beam with respect to the plane mirror 41 is varied, and the spot of the laser beam is caused to scan in the direction Y on the target 3.

Secondly, in addition to the galvanometer mirror 40 for the scanning in the direction Y, there is provided a galvanometer mirror 50 for deflecting a laser beam in the direction X. The galvanometer 50 comprises a plane mirror 51, a shaft 52, and a reversible driving means 5S. Thus, it is possible that the spot of a laser beam on the target 3 is caused to scan in the direction X by the galvanometer 50 while being caused to scan by the galvanometer 40 on the target 3 in the direction Y. Accordingly in the second embodiment a mechanism for transfer the substrate holder 2, e.g., the transferring means of FIG. 2, is not necessary. This is a third difference of the second embodiment from the first one.

In forming a thin film using the device according to the second embodiment, while the mirror 40 for the scanning in the direction X is being driven, the mirror 50 for the scanning in the direction Y is driven at a relatively low speed. At this time, the target 3 does not have to be moved. The target 3 is irradiated with a laser beam over a large area, and accordingly the consumption of the target can be minimized. Furthermore, a homogeneous, high-quality superconducting thin film can be formed over a large area of a stationary substrate 1.

This invention is not limited to the above-described embodiments, but rather, it covers various modifications. To give an example, the optical system for causing a laser beam to scan is not limited to the optical system of the type in which a reflecting mirror is movable, but instead, an optical system of the type in which the optical refractive index is variable may be used. For example, electrooptic crystals, such as LiNbO$_3$, can vary the refractive index by an electric field. It is possible to cause a laser beam to transmit through these crystal which have electrodes so that the laser beam is caused to scan in the above-mentioned directions X and Y by applying a voltage to the electrodes. The deflection of a laser beam in the direction X can be performed by moving the laser beam source 11, because the scanning in the direction X is slower than in the direction Y. In short, the device according to this invention is characterized in that a substrate for a thin film to be formed on is moved at a low speed in the direction X while causing the laser beam to scan in the direction Y by an optical system at a relatively high speed, or the optical axis of a laser beam is moved (or deflected) in the direction X at a low speed. These characteristics may be practiced by any means.

The superconducting thin film formed by laser evaporation has little diffusion of a substrate material into a superconducting thin film. Therefore, the superconducting film is of high quality, because laser evaporation can omit post-annealing from the thin film forming process. The oxide superconducting thin film formed by the device according to this invention is suitably usable in various devices, such as a string of thin film devices, superconducting quantum interference devices (SQUIDs), etc.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A device for forming a compound oxide superconducting film on a substrate, comprising:

a holding means for holding a target made of a compound oxide superconducting material;

a laser beam irradiating means for irradiating the target by a laser beam to evaporate a thin film corresponding to the oxide superconducting material of the target onto the substrate;

means for scanning the laser over the target in a one dimensional scanning direction;

transfer means for moving the substrate in a transfer direction, wherein the transfer direction is perpendicular to the one-dimensional scanning direction, wherein said transfer means includes (a) a frame having plural pairs of guide rollers arranged such that the guide rollers of each pair are arranged opposite to one another, (b) a substrate holder, wherein the frame and substrate holder are movable with respect to one another in said transfer direction, and (c) a heater for heating the substrate to be held thereon; and an oxygen supply means disposed proximate the substrate for supplying O$_2$ gas on a surface of the substrate on which the oxide superconducting film is to be formed;

whereby laser beam evaporation is performed in an oxygen ambient atmosphere.

2. A device according to claim 1, wherein said pairs of guide rollers engage in guide grooves defined in opposed sides of the substrate holder.

3. A device according to claim 2, wherein the heater includes a rod shaped heating body arranged perpendicular to said transfer direction.

4. A device according to claim 2, wherein the heater includes a plurality of rod shaped heating bodies arranged perpendicular to said transfer direction.

\* \* \* \* \*